(12) United States Patent
Sunaoshi et al.

(10) Patent No.: US 8,040,146 B2
(45) Date of Patent: Oct. 18, 2011

(54) INSPECTION APPARATUS HAVING A HEATING MECHANISM FOR PERFORMING SAMPLE TEMPERATURE REGULATION

(75) Inventors: Takeshi Sunaoshi, Hitachinaka (JP); Kouichi Kurosawa, Hitachi (JP); Takeshi Sato, Hitachinaka (JP); Masaaki Komori, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 12/693,266

(22) Filed: Jan. 25, 2010

(65) Prior Publication Data
US 2010/0123474 A1    May 20, 2010

Related U.S. Application Data

(63) Continuation of application No. 12/146,029, filed on Jun. 25, 2008, now Pat. No. 7,663,390.

(30) Foreign Application Priority Data

Jun. 25, 2007  (JP) ................................ 2007-165899

(51) Int. Cl.
  *G01R 31/308* (2006.01)
(52) U.S. Cl. ............ 324/750.12; 324/750.01; 250/492.2
(58) Field of Classification Search .................. None
See application file for complete search history.

(56) References Cited

U.S. PATENT DOCUMENTS

| | | | |
|---|---|---|---|
| 5,439,777 A * | 8/1995 | Kawada et al. .......... 430/270.15 |
| 5,631,571 A | 5/1997 | Spaziani et al. |
| 6,734,687 B1 | 5/2004 | Ishitani et al. |
| 6,747,464 B1 | 6/2004 | Blackwood |
| 6,971,791 B2 | 12/2005 | Borden et al. |
| 7,071,713 B2 | 7/2006 | Furukawa et al. |
| 7,129,727 B2 | 10/2006 | Saito et al. |
| 7,372,283 B2 | 5/2008 | Furukawa et al. |
| 7,663,390 B2 * | 2/2010 | Sunaoshi et al. ......... 324/750.12 |
| 2003/0146761 A1 | 8/2003 | Pakdaman et al. |

FOREIGN PATENT DOCUMENTS

| | | |
|---|---|---|
| JP | 09-326425 | 12/1997 |
| JP | 2005-210067 | 8/2005 |
| JP | 2006-125909 | 5/2006 |

OTHER PUBLICATIONS

Mizuno et al "Development of High Temperature Sample Stage for Nano-Prober" LSI Testing Symposium-2006 pp. 301-304 The Institute of LSI Testing, (2006).

* cited by examiner

*Primary Examiner* — Minh N Tang
(74) *Attorney, Agent, or Firm* — McDermott Will & Emery LLP

(57) ABSTRACT

There are provided an inspection apparatus and method that can locally perform sample temperature regulation, so that the sample drift can be suppressed. There are included a sample stage 109 that holds a semiconductor sample 118, multiple probes 106 used to measure electrical characteristics of a semiconductor device on the semiconductor sample 118, a power source that applies voltage and/or current to the probe 106, a detector that measures electrical characteristics of the semiconductor device on the sample with which the probe is brought into contact, and an electromagnetic wave irradiating mechanism that irradiates electromagnetic wave on a measurement section of the semiconductor sample 118.

20 Claims, 9 Drawing Sheets

# INSPECTION APPARATUS HAVING A HEATING MECHANISM FOR PERFORMING SAMPLE TEMPERATURE REGULATION

RELATED APPLICATIONS

This application is a Continuation of U.S. application Ser. No. 12/146,029 now U.S. Pat. No. 7,663,390, filed on Jun. 25, 2008 and issued on Feb. 16, 2010, claiming priority of Japanese Patent Application No. 2007-165899, filed on Jun. 25, 2007, the entire contents of each of which are hereby incorporation by reference.

BACKGROUND OF THE INVENTION

1. Field of the Invention

The present invention relates to an inspection apparatus and method that inspects electrical characteristics of a semiconductor device by use of a probe.

2. Background Art

As an inspection apparatus used to inspect electrical defects of a microscopic electrical circuit formed on a semiconductor chip, there are known inspection apparatuses including: an electrical beam tester that irradiates an electrical beam and detects electrically defective sections of an LSI, using the fact that the discharge rate of secondary electron from a measurement point varies according to the voltage value at the measurement section; and a probe apparatus in which multiple mechanical probes (exploring needles) arranged in a manner adjusted to the position of a characteristic measuring pad formed on an LSI is brought into contact with the measuring pad, so that electrical characteristics of the LSI are measured. Examples of the techniques related to such probe apparatus include ones described in Patent Documents 1, 2 and 3.

Patent Document 1 describes a defect inspection apparatus in which a probe (exploring needle) is arranged in a sample chamber of SEM (Scanning Electron Microscope), and the tip end of the probe is brought into contact with a desired section of an electrical device being the test sample while the electrical device is observed using the SEM, so that electrical characteristics of the microscopic electrical device are measured.

Patent Document 2 describes a defect inspection apparatus using a scanning electron microscope, the apparatus including: separate drive apparatuses which respectively drive a probe and a sample table on which a sample is placed; and a base stage drive apparatus which drives the probe and sample table in an integrated manner, wherein there is used a CAD navigation system which uses data of scanning electron microscope images and wire layout, so that scanning electron microscope images at a desired contact section are acquired to perform probe contact.

Patent Document 3 describes a defect inspection apparatus including GUI (Graphical User Interface) used to easily control the position, operation and the like of multiple probes which can be driven separately.

[Patent Document 1] JP Patent Publication (Kokai) No. 9-326425A

[Patent Document 2] JP Patent Publication (Kokai) No. 2005-210067A

[Patent Document 3] JP Patent Publication (Kokai) No. 2006-125909A

SUMMARY OF THE INVENTION

In recent years, in the fields of semiconductor device electrical characteristic evaluation techniques, there is increasing demand for temperature characteristic evaluation techniques for reliability and safety evaluation of semiconductor device, in addition to electrical characteristic evaluation of the electrical circuit and electrical characteristic evaluation of the constituent semiconductor.

In a temperature characteristic evaluation according to related art, a semiconductor sample to be inspected is secured to a sample table; and the following operation is repeated. That is, first, at room temperature, the tip end of a probe is brought into contact with a measurement pad of the semiconductor sample to measure electrical characteristics, and thereafter the tip end is slightly withdrawn, and subsequently the temperature of the whole sample is regulated (heating or cooling), and after the sample has reached thermal balance, the probe tip end is brought into contact with the measurement pad of the semiconductor sample to measure electrical characteristics, and thereafter the tip end is slightly withdrawn.

In such temperature characteristic evaluation, during the temperature regulation, the temperature of the whole sample chamber containing the sample table, probing mechanism and the like is varied, and thus expansion and contraction of the sample table, probing mechanism and the like caused by this temperature variation produces sample drift. Accordingly, the probe contact position must be adjusted each time the temperature regulation is performed, so it takes much labor; and at the same time, the length of time taken from when temperature regulation is performed to when thermal balance is reached so that the sample drift stops, is very long, causing throughput deterioration. In order to improve the throughput, the probe may be brought into contact with the measurement pad during the sample drift to measure electrical characteristics. However, such forced contact operation during the sample drift causes breakage or wear of the probe tip end and the sample measurement pad, resulting in life shortening of the probe and test sample. Further, the increase in electrical noise caused by heating of the sample table, probing mechanism and the like may have adverse influence on measurement accuracy and measurement stability.

To address the above problem, the present invention has been devised, and its object is to provide an inspection apparatus and method that can locally perform sample temperature regulation, so that the sample drift can be suppressed.

To achieve the above object, the present invention includes: a sample stage that holds a sample; and an electromagnetic wave irradiating apparatus that irradiates electromagnetic wave on the sample, wherein the temperature of the sample is regulated by irradiating electromagnetic wave on the sample.

According to the present invention, since electromagnetic wave is irradiated on a measurement section of the sample to perform sample temperature regulation, sample temperature regulation can be locally performed, so that sample drift can be suppressed.

DESCRIPTION OF SYMBOLS

1 SEM
2 SAMPLE DRIVE APPARATUS
3, 3A SAMPLE MEASURING APPARATUS
4 CONTROL SYSTEM
5, 5A ELECTROMAGNETIC WAVE CONTROL SYSTEM
100, 100A DEFECT INSPECTION APPARATUS
101 ELECTRICAL BEAM COLUMN
102 VACUUM CHAMBER CONFINING WALL
103 PRIMARY ELECTRON BEAM
104 SECONDARY ELECTRON DETECTOR
105 SECONDARY ELECTRON
106 PROBE (MECHANICAL PROBE)
107, 107A, 107B ATTACHMENT
108 PROBE DRIVE UNIT
109 SAMPLE TABLE
110 SAMPLE TABLE DRIVE APPARATUS
111 BASE STAGE
112 BASE
113 ELECTRICAL CHARACTERISTIC MEASURING UNIT
114 CONTROL COMPUTER
115 STORAGE DEVICE
116 ELECTRON GUN CONTROL APPARATUS
117 SEM CONTROL PC
118 SEMICONDUCTOR SAMPLE
119, 120 OPTICAL FIBER
121 ELECTROMAGNETIC WAVE SOURCE
122 ELECTROMAGNETIC WAVE MEASURING MECHANISM
123 ELECTROMAGNETIC WAVE CONTROL MECHANISM
124 ELECTROMAGNETIC WAVE SOURCE AND ELECTROMAGNETIC WAVE MEASURING MECHANISM
125A, 125B TIP END
126, 126A, 126B, 127 OPTICAL FIBER
203 TO 206 MEASUREMENT PAD
227 OPTICAL FIBER
301 OPTICAL FIBER UNIT
302 LENS UNIT
303 OPTICAL FIBER
304 PROCESSING MARKING

DETAILED DESCRIPTION OF THE PREFERRED EMBODIMENTS

Embodiments of the present invention will be described with reference to the drawings.

A first embodiment of the present invention will be described with reference to FIGS. 1 to 4.

Figure 1:
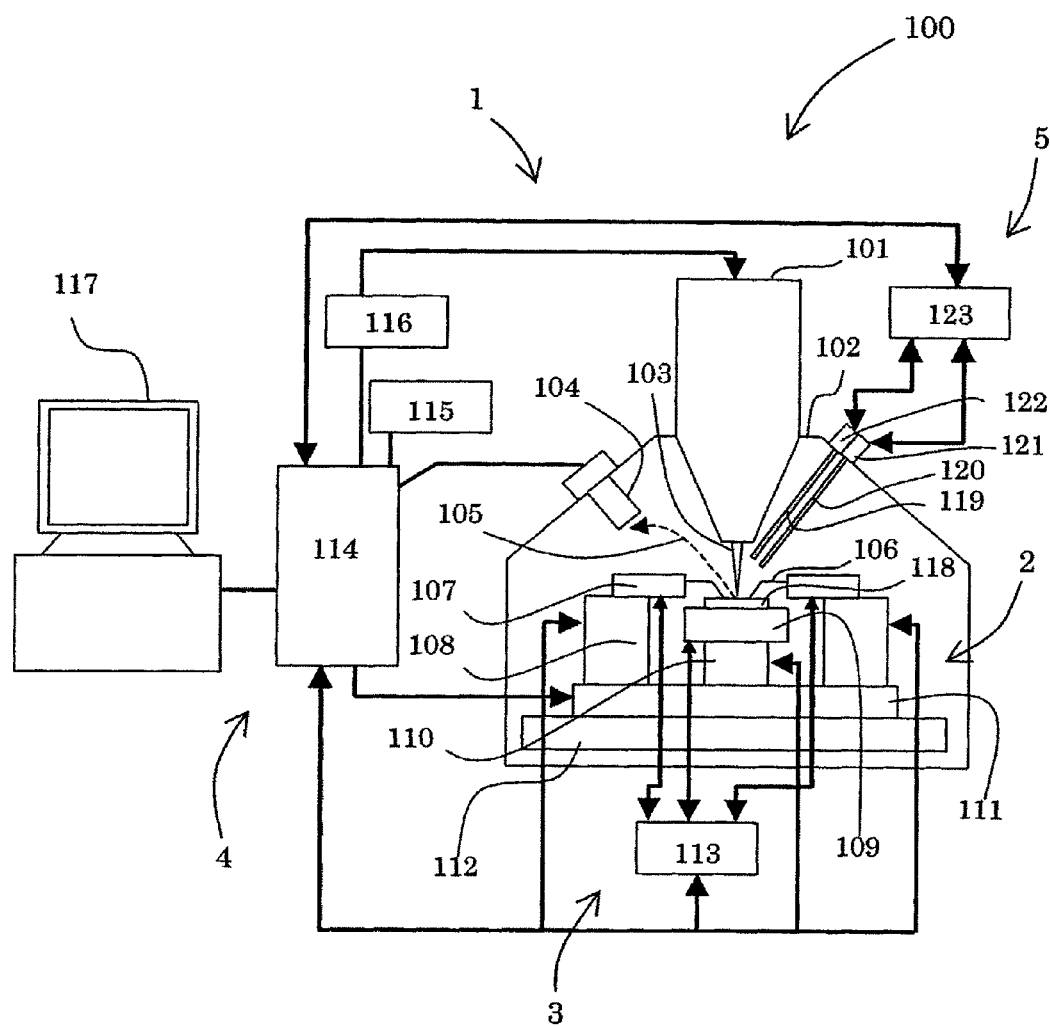
FIG. 1 is a view illustrating an overall configuration of a defect inspection apparatus according to a first embodiment of the present invention.

FIG. 1 is a view illustrating an overall configuration of a defect inspection apparatus according to the present embodiment.

Referring to FIG. 1, a defect inspection apparatus 100 according to the present embodiment includes an SEM (Scanning Electron Microscope: hereinafter referred to as an SEM) 1, sample drive apparatus 2, sample measuring apparatus 3, control system 4, electromagnetic wave control system 5 and SEM control PC 117.

The SEM 1 includes an electron source (not illustrated) that emits primary electron beam 103, an electron beam optical system that guides the primary electron beam 103 and irradiates it on a semiconductor sample 118 being the test sample, secondary electron detector 104 that detects secondary electron 105 emitted from the semiconductor sample 118 by irradiation of the primary electron beam 103, and electron beam optical system control apparatus 116 that controls the operation of the electron beam optical system, i.e., the electron beam withdrawing voltage of the electron source and the applied voltage to a deflector lens. The electron beam optical system according to the present embodiment constitutes an irradiation optical system that irradiates the primary electron beam 103 on the test sample and at the same time, scans the test sample, and includes an electron source that generates electron beam, a deflection apparatus used for beam scanning, and a lens used to focus electron beam.

The defect inspection apparatus 100 according to the present embodiment further includes multiple optical microscopes, CCD cameras (not illustrated) and the like used to acquire top or side images of the semiconductor sample 118 held on a sample table 109 arranged inside a vacuum chamber confining wall 102.

The vacuum chamber confining wall 102 is a wall which separates the atmospheric pressure area and vacuum area. An irradiation unit of an electron beam column 101 which covers the electron beam optical system of the SEM 1, and a sensor unit of the secondary electron detector 104 which detects electron are arranged inside the vacuum chamber confining wall 102; but the units to which power and transmission lines are connected, protrude to the outside of the vacuum chamber confining wall 102. That is, the electron beam column 101 which covers the electron beam optical system of the SEM 1, and the secondary electron detector 104 are arranged so as to penetrate through the vacuum chamber confining wall 102.

The sample drive apparatus 2 includes: the sample table 109 which holds the semiconductor sample 118; a sample table drive apparatus 110 which holds the sample table 109 and drives the sample table 109 in an X and Y (horizontal) direction; a base stage 111 which holds the sample table drive apparatus 110 and includes a drive apparatus which drives the sample table drive apparatus 110 in an X, Y (horizontal) and Z (vertical) direction; and a base 112 which holds the base stage 111. The sample table 109 and sample table drive apparatus 110 are collectively referred to as a sample stage. On the base stage 111, there is held a probe drive unit (to be described later) 108 along with the sample stage; and when the base stage 111 is driven and moved relative to the base 112, the sample stage and probe drive unit 108 can be driven in an integrated manner. The sample stage, base stage 111 and base 112 are arranged inside the vacuum chamber confining wall 102.

The sample measuring apparatus 3 includes: multiple (for example, 6) mechanical probes (only two of them illustrated in FIG. 1) 106 which are brought into contact with a given section of the semiconductor sample 118; multiple (for example, 6) attachments 107 being probe holders which hold each of the multiple mechanical probes (hereinafter, simply referred to as a probe) 106; multiple (for example, 6) probe drive units 108 which hold each of the attachments 107 and moves the probe 106 to a desired position along with the attachment 107; and an electrical characteristic measuring unit 113 which measures electrical characteristics of the semiconductor sample 118 through the probe 106.

The probe 106 is brought into contact with predetermined sections such as measurement pads 203, 204, 205 and 206 (refer to FIG. 3 to be described later) of the semiconductor sample 118; electrical characteristics of the semiconductor sample 118 are measured through the probe 106 (the measurement will be described later).

The probe drive unit 108 is held on the base stage 111 along with the sample stage of the sample drive apparatus 2. The six probe drive units 108 drive the respective probes 106 in an X, Y (horizontal) and Z (vertical) direction on a per attachment 107 basis.

In the sample stage, the semiconductor sample 118 can be driven by driving the sample table 109; and the probe drive units 108 can drive the six probes 106 separately; and the base stage 111 can drive the sample stage and probe drive unit 108 in an integrated manner. Accordingly, the semiconductor sample 118 and probe 106 can be driven separately or in an integrated manner. Further, when the sample table 109 is driven and moved by the sample table drive apparatus 110 relative to the base stage 111, the relative position between the six probes 106 and the semiconductor sample 118 can be varied without varying the relative position between the six probes 106.

The electrical characteristic measuring unit 113 of the sample measuring apparatus 3 is installed outside the vacuum chamber confining wall 102; and the probes 106, attachments 107 and probe drive units 108 are installed inside the vacuum chamber confining wall 102.

The electrical characteristic measuring unit 113 includes: a power source (not illustrated) which applies through the probes 106, current and voltage to desired sections of the semiconductor sample 118 such as the measurement pads 203, 204, 205 and 206 (refer to FIG. 3 to be described later); and a detector (not illustrated) which detects current and voltage at the desired sections of the semiconductor sample 118. The sample table 109 and attachments 107 are connected to the electrical characteristic measuring unit 113; and the electrical characteristic measuring unit 113 measures current-voltage characteristics of the semiconductor sample 118 mainly through the probes 106 and attachments 107, and calculates desired characteristic values based on the current-voltage characteristics. Examples of the characteristic values include a current value, voltage value and resistance value at a section with which the probe 106 is brought into contact. As with the present embodiment, when a semiconductor sample is used as the test sample, a semiconductor parameter analyzer is used as the electrical characteristic measuring unit 113, for example. Waveforms and characteristic values (hereinafter, simply referred to as electrical characteristic data) of the current-voltage characteristics of the semiconductor sample 118 measured by the electrical characteristic measuring unit 113 are sent to a control computer 114 of the control system 4 via a transmission line.

The electromagnetic wave control system 5 includes; an electromagnetic wave source (electromagnetic wave generating apparatus) 121 which generates electromagnetic wave; an optical fiber 120 used to irradiate the electromagnetic wave generated by the electromagnetic wave source 121 on a measurement section of the semiconductor sample 118; an electromagnetic wave measuring mechanism 122 which detects an intensity of electromagnetic wave emitted from the measurement section of the semiconductor sample 118; an optical fiber 119 used to transmit electromagnetic wave radiated from the measurement section of the semiconductor sample 118 to the electromagnetic wave measuring mechanism 122; and an electromagnetic wave control mechanism 123 which calculates a temperature of the semiconductor sample 118 based on the intensity of the electromagnetic wave (for example, infrared) measured by the electromagnetic wave measuring mechanism 122 and outputs the temperature data to the control computer 114 and at the same time, regulates the frequency and intensity of electromagnetic wave generated by the electromagnetic wave source 121 based on a command signal from the control computer 114. In the present example, the electromagnetic wave measuring mechanism 122 and electromagnetic wave control mechanism 123 constitutes a temperature measuring mechanism which measures a temperature at an electromagnetic wave irradiation section of the semiconductor sample 118. Here, when the electromagnetic wave measuring mechanism 122 has a function to convert an electromagnetic wave detection value to a temperature measurement value, the electromagnetic wave measuring mechanism 122 can perform temperature measurement alone; thus the function to calculate a temperature of the semiconductor sample 118 can be omitted in the electromagnetic wave control mechanism 123.

The electromagnetic wave source 121 can generate electromagnetic wave of different frequencies. Examples of specific methods for regulating the frequency of generated electromagnetic wave include one which selects the type of light source which generates electromagnetic wave, and one which selects and outputs electromagnetic wave of a given frequency from among electromagnetic waves from an electromagnetic wave generating light source. An example of the former method is one which rotates a light source switching mechanism in which light sources generating electromagnetic wave of a different frequency are arranged in a revolver-like shape, whereby the type of light source is varied. An example of the latter method is one which selects a given wavelength using a diffraction grating. The electromagnetic wave source 121 generates electromagnetic wave such as infrared ray (wavelength: 0.7 μm to 1 mm) and ultraviolet ray (wavelength: 10 nm to 400 nm).

The electromagnetic wave source 121, electromagnetic wave measuring mechanism 122 and electromagnetic wave control mechanism 123 are installed in the outside of the vacuum chamber confining wall 102. The optical fibers 119 and 120 having one end thereof connected to the electromagnetic wave source 121 and electromagnetic wave measuring mechanism 122 are arranged so as to penetrate through the vacuum chamber confining wall 102; the other end thereof is arranged in the vicinity of a measurement section of the semiconductor sample 118, the tip end thereof facing the measurement section (refer to FIG. 2 to be described later).

The control system 4 includes the control computer 114 and a storage device 115 such as memory. The electrical characteristic data of the semiconductor sample 118 measured by the electrical characteristic measuring unit 113 and sent to the control computer 114 are stored in the storage device 115 included in the control computer 114, such as an optical disk, hard disk or memory; and the control computer 114 analyzes the electrical characteristics and thereby determines whether or not there is a defect at the measurement section of the semiconductor sample 118. Further, the control computer 114 also plays a role of controlling the operation of the whole defect inspection apparatus 100; after parameters for each apparatus have been set through an input unit, the control computer 114 controls, according to software stored in the storage device 115, the constituent apparatuses including an electron gun control apparatus 116, secondary electron detector 104, electromagnetic wave control mechanism 123, sample stage and base stage 111.

An SEM control PC 117 controls, according to a GUI (Graphical User Interface) operation or a command input to the keyboard, the optical conditions, magnifying power, focusing, image shift, SEM image brightness, scan speed, alignment, image recording of the SEM 1, and the position of the sample stage of the sample drive apparatus 2, and the position of the probe 106 of the sample measuring apparatus 3. The SEM control PC 117 sends a control signal via the control computer 114 to the electron gun control apparatus 116 to thereby control the electron beam optical system (not illustrated), and acquire a detection signal detected by the secondary electron detector 104, and controls the operations of the sample table drive apparatus 110, base stage 111, probe drive unit 108, optical microscope, CCD camera and the like.

Figure 2:
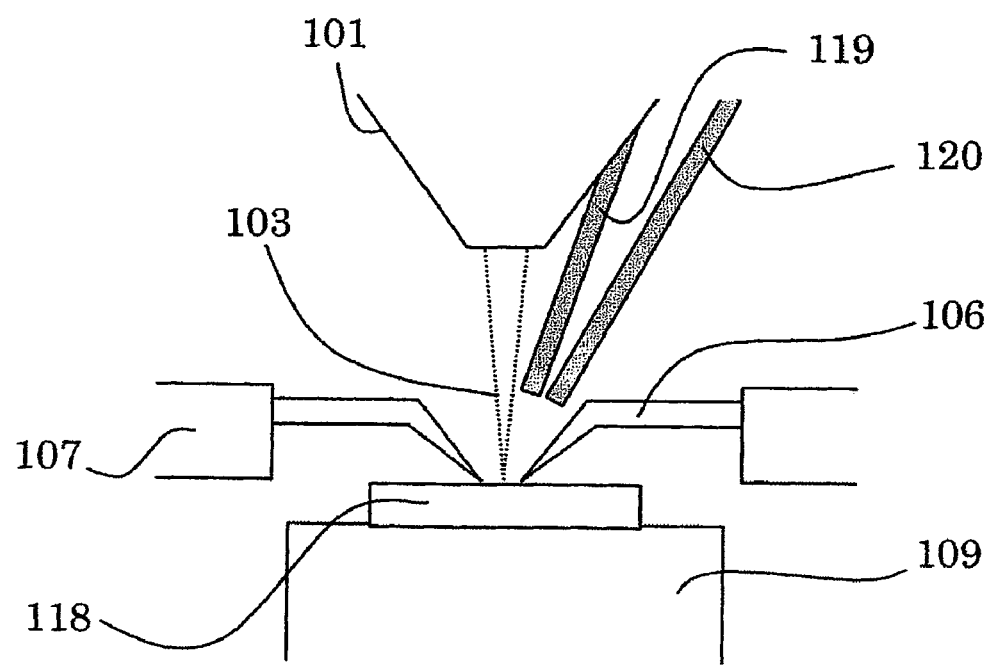
FIG. 2 is a lateral view of an optical microscope image when an electrical characteristic measurement according to the first embodiment of the present invention is performed.

FIG. 2 is a lateral view of an optical microscope image when an electrical characteristic measurement is performed at a defect inspection apparatus according to the present embodiment of the present invention.

Referring to FIG. 2, the semiconductor sample 118 is held on the sample table 109; and on a measurement section of the semiconductor sample 118, there is irradiated the primary electron beam 103 from the electron beam optical system (not illustrated) of the SEM 1 and at the same time, the probe 106 is brought into contact with the measurement pads (refer to FIG. 3 to be described later) 203, 204, 205 and 206. Further, one ends of the optical fibers 119 and 120 are arranged in the vicinity of the measurement section of the semiconductor sample 118, the tips ends thereof facing the measurement section. In this state, electromagnetic wave (for example, infrared or ultraviolet) is generated by the electromagnetic wave source 121 and irradiated via the optical fiber 120 to the measurement section of the semiconductor sample 118.

For example, when infrared (for example, far-infrared ray of wavelength 4 μm to 1 mm) is generated by the electromagnetic wave source 121 and irradiated via the optical fiber 120 to the measurement section of the semiconductor sample 118, the measurement section is locally heated by the working of irradiated infrared. All sorts of materials emit infrared of an intensity proportional to its temperature; the infrared emitted from the measurement section is inputted via the optical fiber 119 to the electromagnetic wave measuring mechanism 122 to measure the infrared, and data of the infrared intensity is sent to the electromagnetic wave control mechanism 123, whereby the temperature of the measurement section of the semiconductor sample 118 can be measured based on the data. The control computer 114 regulates the intensity of infrared generated by the electromagnetic wave source 121 so that the difference between a setting temperature and the temperature of the measurement section of the semiconductor sample 118 thus acquired is reduced, whereby the temperature of the measurement section is regulated.

When ultraviolet ray (wavelength: 10 nm to 400 nm) is generated by the electromagnetic wave source 121 and irradiated via the optical fiber 120 on the measurement section of the semiconductor sample 118, charging and contamination on the surface of the semiconductor sample 118 can be removed. As the electromagnetic wave effective in eliminating charging, there is known ultraviolet ray of wavelength of 253.7 nm, for example. Also, for example, while a proper amount of oxygen is brought into the vacuum chamber confining wall 102, when ultraviolet rays of wavelengths of, for example, 184.9 nm and 257.7 nm (generated by a low-pressure ultraviolet lamp or the like) are irradiated on the semiconductor sample 118, contaminants (for example, organic matter such as carbon and the like) on the surface of the semiconductor sample 118 can be removed.

Figure 3:
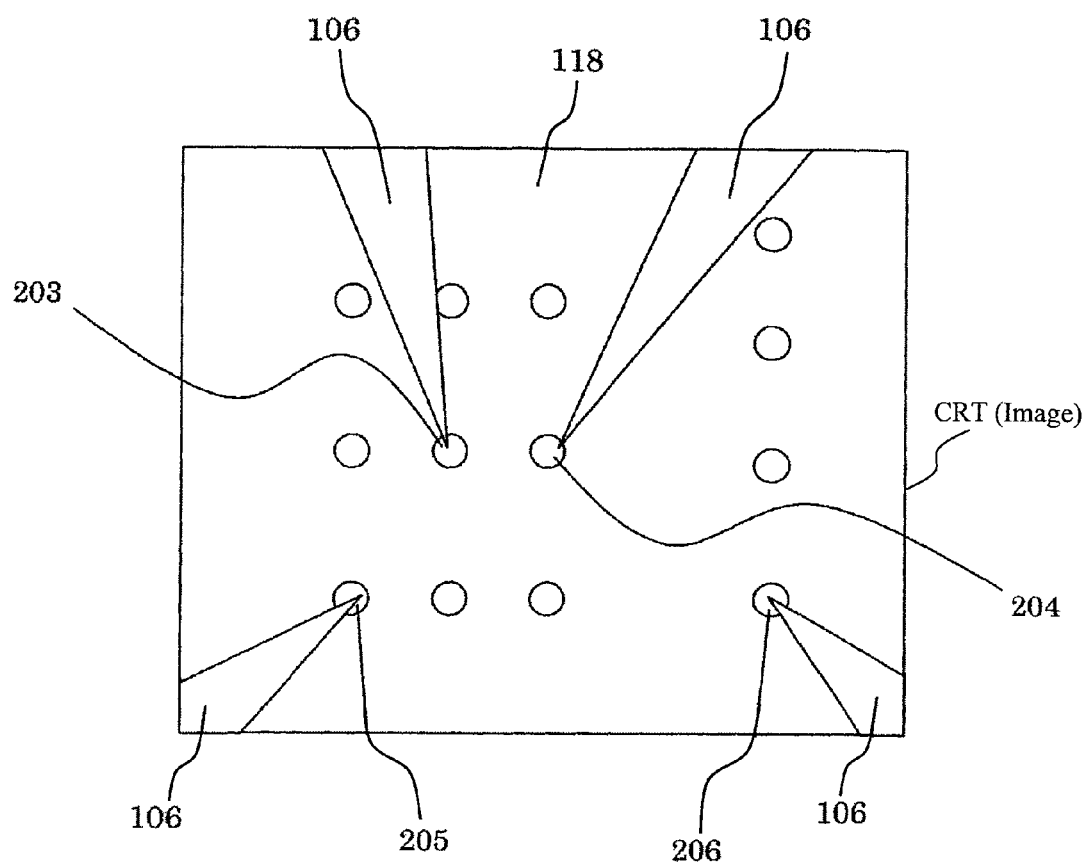
FIG. 3 is a view illustrating an SEM image when an electrical characteristic measurement according to the first embodiment of the present invention is performed.

FIG. 3 is a view illustrating an SEM image when electrical characteristics of the semiconductor sample 118 is measured.

Referring to FIG. 3, the semiconductor sample 118 includes measurement pads 203, 204, 205 and 206 connected respectively to the source, drain, gate and well, and four probes 106 of the six probes 106 included in the sample measuring apparatus 3 are brought into contact with the respective measurement pads by the probe drive unit 108 and the like. Two probes 106 not brought into contact with the measurement pads are withdrawn to a position which does not interrupt the driving of the other probes 106 and the like.

In this state, voltage is applied via the measurement probe 106 to a desired measurement pad by the electrical characteristic measuring unit 113, and voltage and current of the desired measurement pad are measured via the measurement probe 106, whereby electrical characteristic data of the semiconductor sample 118 are acquired. For example, while voltage is applied between the measurement pad 203 connecting to the source and the measurement pad 204 connecting to the drain, when voltage is applied to the measurement pad connecting to the gate to measure current flowing between the measurement pad (source) 203 and the measurement pad (drain) 204, waveform (current-voltage characteristics) indicating a relationship between the gate voltage and drain current at the given source-drain voltage can be acquired. The waveform of current-voltage characteristics and the electrical characteristic data such as the characteristic values are displayed on a display unit (not illustrated) of the electrical characteristic measuring unit 113 and at the same time, sent to the control computer 114.

The operation of the present embodiment having the above configuration will be described.

In the defect inspection apparatus 100 according to the present embodiment, when a semiconductor sample 118 being an exemplary test sample is measured, the semiconductor sample 118 is held on the sample table 109.

First, while the SEM control PC 117 is manipulated and the positional relationship in a horizontal and vertical direction between the measurement section of the semiconductor sample 118 and the four probes 106 used in the present embodiment is observed based on low-magnification observation images of the optical microscope, the four probes 106 are driven in a horizontal and vertical direction, whereby the proportional positional relationship between the measurement section of the semiconductor sample 118 and the four probes 106 is made to approach a range which can be observed by the SEM 1.

Subsequently, while the measurement section of the semiconductor sample 118 and the four probes 106 are observed using the SEM 1, for example, the four probes 106 are brought into contact with desired measurement pads of the semiconductor sample 118.

In this state, electric power is supplied by the electrical characteristic measuring unit 113 such as a semiconductor parameter analyzer, so that voltage and current are supplied via the desired probes 106 to the measurement pads of the semiconductor sample 118; at the same time, voltage and current of the measurement pads of the semiconductor sample 118 are measured through the desired probes 106, whereby waveforms of current-voltage characteristics of the semiconductor sample 118 at room temperature are acquired. The electrical characteristic measuring unit 113 calculates based on current-voltage characteristics, the desired characteristic values such as current value, voltage value and resistance value, and displays the characteristic values and the waveforms of current-voltage characteristics on a display unit (not illustrated) and at the same time, sends them via a transmission line to the control computer 114. The control computer 114 stores the characteristic values sent from the electrical characteristic measuring unit 113 into the storage device 115 and at the same time, analyzes the characteristic values and thereby determines whether or not there is a defect at the measurement section of the semiconductor sample 118. After the measurement of current-voltage characteristics of the semiconductor sample 118 at room temperature, the supplying of current and voltage to the measurement pads of the semiconductor sample 118 is terminated.

Subsequently, the measurement section temperature of the semiconductor sample 118 is set using the input unit of the control computer 114. The control computer 114 controls the electromagnetic wave control mechanism 123 to cause the electromagnetic wave source 121 to generate infrared ray (for example, far-infrared ray of wavelength of 4 μm to 1 mm), and the infrared ray is irradiated via the optical fiber 120 on the measurement section of the semiconductor sample 118, whereby the measurement section is locally heated. Here, before being brought into contact with the sample, the probe 106 is moved into the electromagnetic wave irradiation area, so that the probe 106 is also heated and thus the thermal loss and thermal expansion occurring when the probe is in contact with the sample can be prevented from occurring. Here, in a state where the probe is brought into contact at room temperature, the probe and the measurement section of the sample may be irradiated with electromagnetic wave while in the contact state. When the temperature of the measurement section of the semiconductor sample 118 reaches a desired setting temperature and stabilizes, the electrical characteristic measuring unit 113 applies via a desired probe 106, voltage and current to the measurement pad of the semiconductor sample 118 and at the same time, measures via a desired probe 106 voltage and current of the measurement pad of the semiconductor sample 118, whereby waveforms of current-voltage characteristics of the semiconductor sample 118 at the desired high temperature can be acquired. The electrical characteristic measuring unit 113 calculates characteristic values based on the current-voltage characteristics, displays the characteristic values and the current-voltage characteristics on a display unit and at the same time, sends them via the transmission line to the control computer 114. The control computer 114 stores the characteristic values sent from the electrical characteristic measuring unit 113 into the storage device 115 and at the same time, analyses the characteristic values and thereby determines whether or not there is a defect at the measurement section of the semiconductor sample 118.

In this way, since the measurement section of the semiconductor sample 118 is locally heated, sample drift caused by thermal expansion of the sample drive apparatus 2 and sample measuring apparatus 3 is suppressed differently from when the whole sample is heated. Consequently, when the change of temperature is made while the probe 106 is in contact with the measurement pad, the bending force exerted on the probe 106 by sample drift can be suppressed. Accordingly, even when the change of temperature is made while the probe 106 is in contact with the measurement pad, the load exerted on the probe 106 and measurement pad can be suppressed.

According to the present embodiment having the above configuration, since the measurement section of the semiconductor sample 118 is locally heated, the expansion and contraction of the sample drive apparatus 2 and sample measuring apparatus 3 can be suppressed and thus the change of temperature can be made while the sample drift is suppressed. Accordingly, when the change of temperature of the semiconductor sample 118 is made, the measurement does not need to be interrupted, as with the related art, until the sample drift settles; thus the throughput can be improved significantly, compared to the related art by which there is a wait until the sample drift settles.

Further, it is possible to prevent the increase in electrical noise caused by heating of the sample drive apparatus, sample measuring apparatus and the like, so measurement accuracy and measurement stability can be ensured.

Further, it is possible to heat a desired section of the semiconductor sample 118 to a desired temperature, so adsorbate such as carbon attached to the desired section of the semiconductor sample 118 can be removed when heated.

Further, ultraviolet ray is irradiated on a desired section of the semiconductor sample 118, so charging and sample contamination of the desired section can be removed at the time of observation by the SEM 1, thus allowing prolonged and stable observation.

A second embodiment of the present invention will be described with reference to FIGS. 4 and 5. The present embodiment includes a lens used to focus the irradiation range of electromagnetic wave, the lens being disposed at the tip end of the optical fiber for electromagnetic wave irradiation according to the first embodiment.

Figure 4:
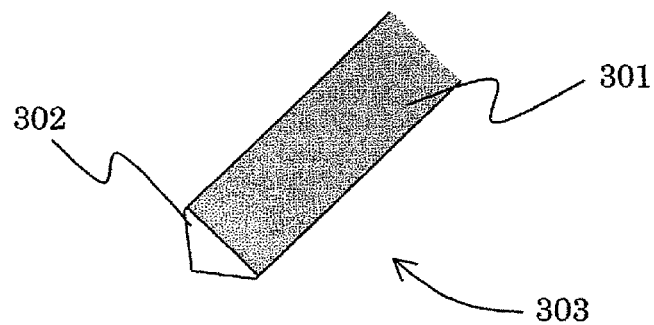
FIG. 4 is a view illustrating details of an optical fiber according to a second embodiment of the present invention.

FIG. 4 is a view illustrating the tip end of the optical fiber for electromagnetic wave irradiation according to the present embodiment.

Referring to FIG. 4, an optical fiber 303 for electromagnetic wave irradiation according to the present embodiment includes an optical fiber unit 301 that transmits electromagnetic wave generated by the electromagnetic wave source 121, and a lens unit 302 that focuses the transmitted electromagnetic wave. The electromagnetic wave (for example, far-infrared ray of wavelength 4 μm to 1 mm) generated by the electromagnetic wave source 121 is transmitted via the optical fiber unit 301, focused by the lens unit 302 and then irradiated, so a processing marking can be made on the semiconductor sample 118.

Figure 5:
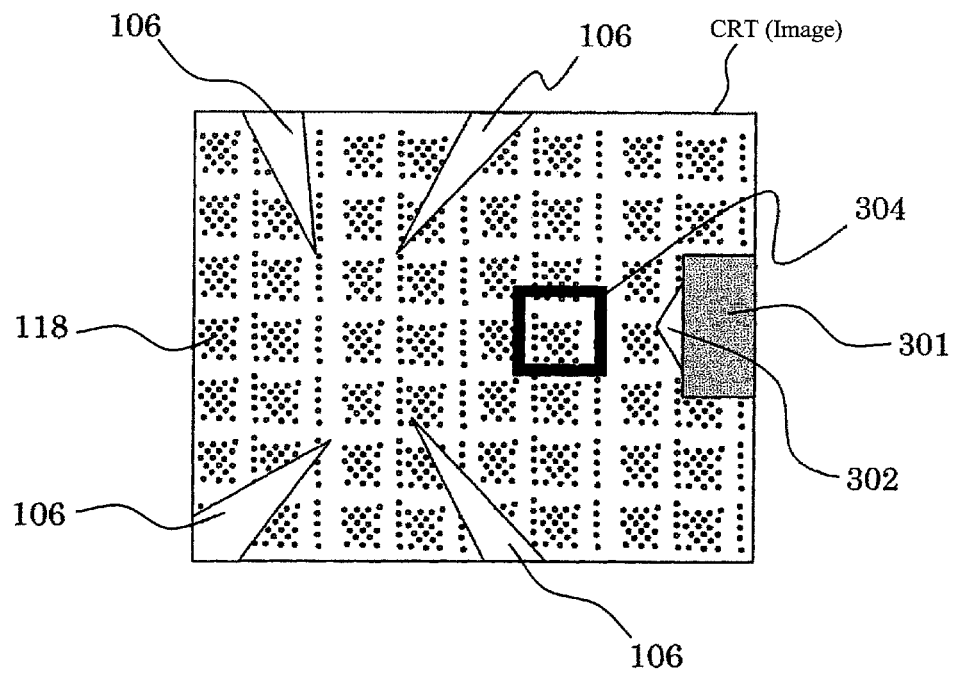
FIG. 5 is a view illustrating an SEM image according to the second embodiment of the present invention.

FIG. 5 is a view illustrating an example of SEM image according to the present embodiment. In the SEM image illustrated in FIG. 5, there are illustrated a semiconductor sample 118, four probes 106 and optical fiber 303. When the sample table 109 is driven, along with the semiconductor sample 118, in an X and Y (horizontal) direction by the sample table drive apparatus 110 while infrared ray generated by the electromagnetic wave source 121 is irradiated via the optical fiber 303 on the semiconductor sample 118, a square-shaped processing marking can be made as indicated by reference numeral 304 in FIG. 5.

The other constituent components are identical to those of the first embodiment of the present invention.

According to the present embodiment having the above configuration, the electromagnetic wave generated by the electromagnetic wave source 121 can be focused and irradiated on a desired section of the semiconductor sample 118, so a processing marking can be made at the irradiation position.

Further, when the semiconductor sample 118 is driven along with the sample table 109 while infrared ray is irradiated on the semiconductor sample 118, a processing marking having a given shape can be made on the semiconductor sample 118.

In the present embodiment, there was described a case where the square-shaped processing marking 304 is made, but the present invention is not limited thereto; when the semiconductor sample 118 is driven in a given direction (horizontal direction), a processing marking having a given shape can be made.

A third embodiment of the present invention will be described with reference to FIGS. 6 to 11. In the drawings, the same reference numerals are applied to parts corresponding to those of FIG. 1, and an explanation thereof is omitted. According to the present embodiment, part of the probe attachment can be replaced with an attachment of the optical fiber for electromagnetic wave irradiation, and the optical fiber for electromagnetic wave irradiation can be driven.

Figure 6:
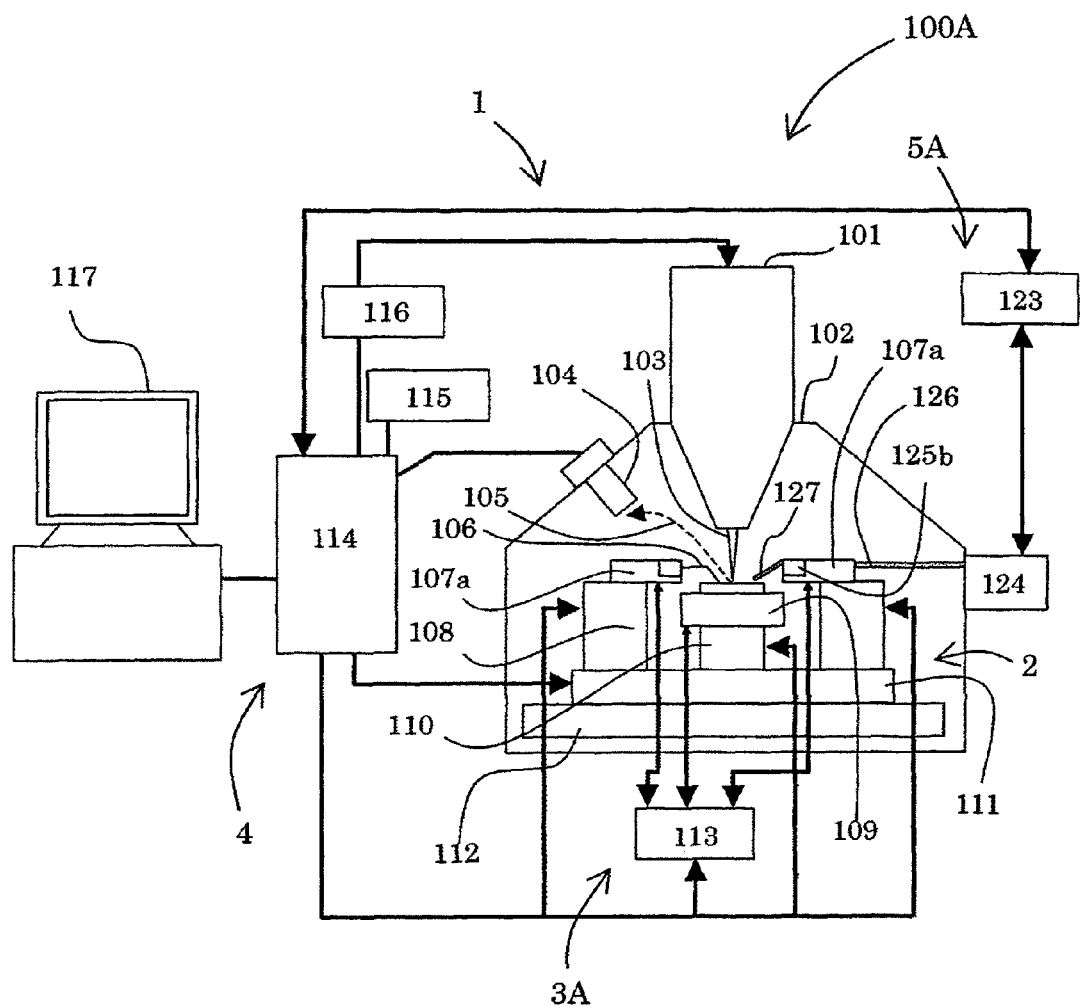
FIG. 6 is a view illustrating an overall configuration of a defect inspection apparatus according to a third embodiment of the present invention.

FIG. 6 is a view illustrating an overall configuration of a defect inspection apparatus 100A according to the present embodiment.

Referring to FIG. 6, the defect inspection apparatus 100A according to the present embodiment includes an SEM (Scanning Electron Microscope: hereinafter, referred to as an SEM) 1, sample drive apparatus 2, sample measuring apparatus 3A, control system 4, electromagnetic wave control system 5A and SEM control PC 117.

The sample measuring apparatus 3A includes: multiple (for example, 4) probes (only one of them illustrated in FIG. 6) 106 which are brought into contact with a given section of the semiconductor sample 118; an optical fiber 127 used to irradiate electromagnetic wave on a desired section of the semiconductor sample 118; an optical fiber 227 (refer to FIG. 10 to be described later) used to receive electromagnetic wave radiated from the desired section of the semiconductor sample 118; multiple (for example, 6) attachments 107a which hold the probes 106 and the optical fibers 127 and 227 through tip ends 125a and 125b, respectively; multiple (for example, 6) probe drive units 108 which hold each of the attachments 107a and moves each of the probe 106 and optical fibers 127 and 227 to a desired position along with the attachment 107a; and an electrical characteristic measuring unit 113 which measures electrical characteristics of the semiconductor sample 118 through the probe 106.

The tip ends 125a and 125b held by the attachment 107a are detachable, and can be replaced with various types of tip ends which hold the probe 106 and optical fibers 127 and 227.

The electromagnetic wave control system 5A includes: an electromagnetic wave source and electromagnetic wave measuring mechanism 124 which generates and outputs electromagnetic wave and at the same time, measures the intensity of received electromagnetic wave; an optical fiber 126 used to transmit the electromagnetic wave generated by the electromagnetic wave source and electromagnetic wave measuring mechanism 124 to the optical fiber 127; an optical fiber (not illustrated) used to transmit the electromagnetic wave received by the optical fiber 227 to the electromagnetic wave source and electromagnetic wave measuring mechanism 124; and an electromagnetic wave control mechanism 123 which calculates a temperature of the semiconductor sample 118 based on the intensity of electromagnetic wave measured by the electromagnetic wave source and electromagnetic wave measuring mechanism 124 and outputs the temperature data to the control computer 114 and at the same time, regulates based on a command signal from the control computer 114, the frequency and intensity of electromagnetic wave generated by the electromagnetic wave source and electromagnetic wave measuring mechanism 124.

The electromagnetic wave source and electromagnetic wave measuring mechanism 124 can vary the frequency of generated electromagnetic wave; the electromagnetic wave is generated, for example, using a method of changing or selecting, in a manner of revolver, a light source generating electromagnetic wave of a different frequency, or a method of selecting each wavelength by use of diffraction grating. The electromagnetic wave source 121 generates electromagnetic wave such as infrared ray (wavelength: 0.7 μm to 1 mm) and ultraviolet ray (wavelength: 10 nm to 400 nm).

Figure 7:
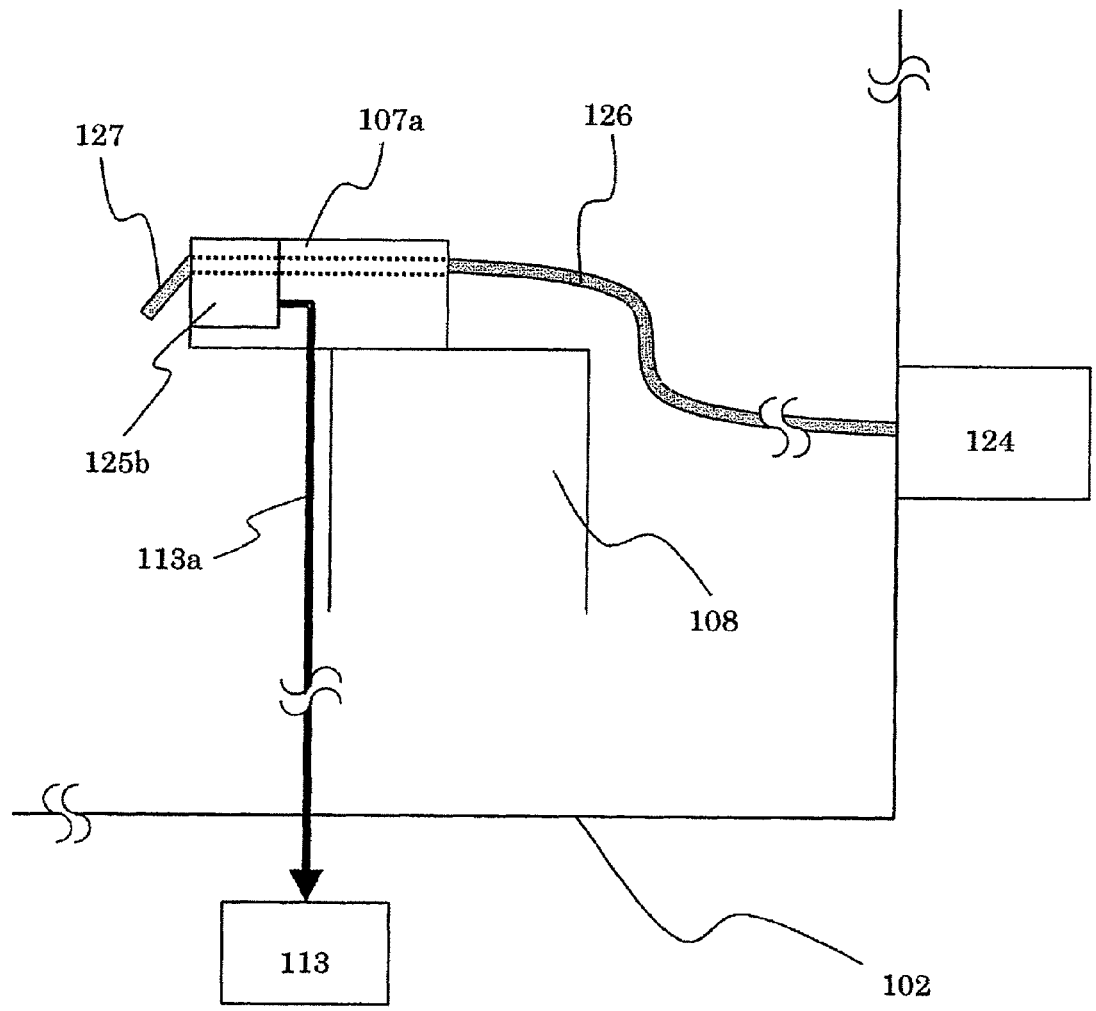
FIG. 7 is a view illustrating an example of attachment and its connection according to the third embodiment of the present invention.
Figure 8:
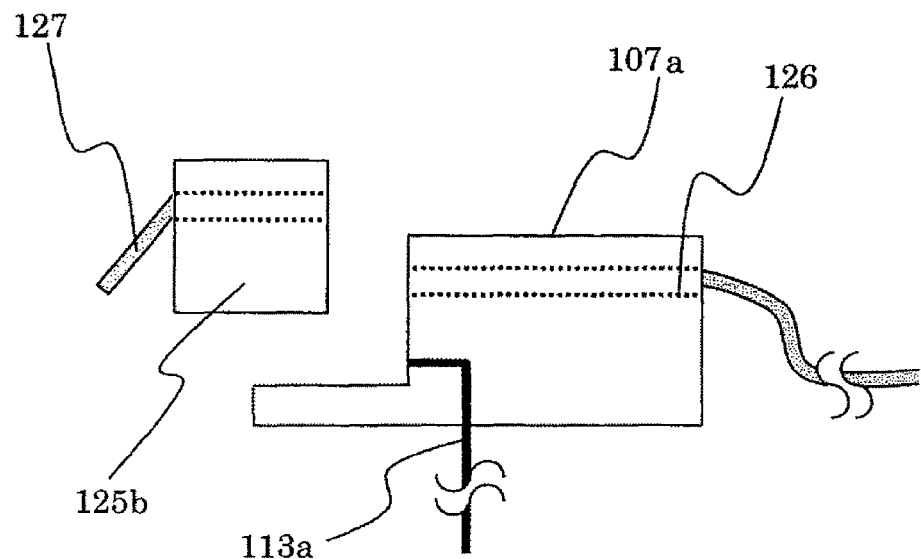
FIG. 8 is a view illustrating details of the attachment according to the third embodiment of the present invention.
Figure 9:
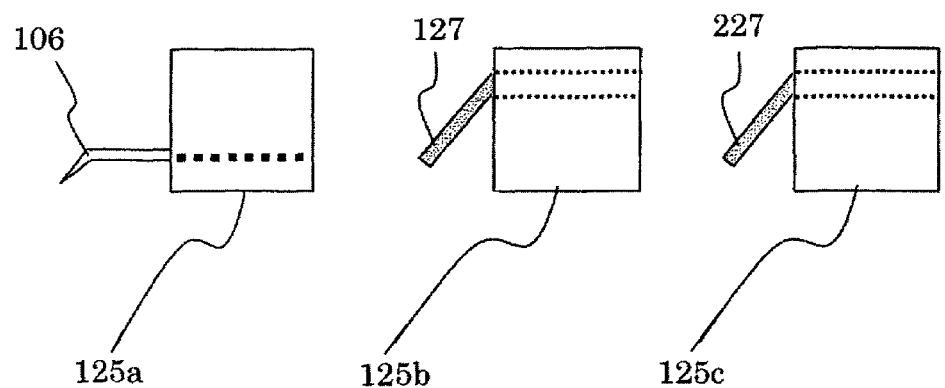
FIG. 9 is a view illustrating details of the tip end according to the third embodiment of the present invention.

FIG. 7 is a view schematically illustrating an example of attachment and its connection according to the present embodiment. FIGS. 8 and 9 are each a view illustrating details of the attachment and its tip end.

Referring to FIG. 7, the attachment 107a is held by the probe drive unit 108, and connected via the optical fiber 126 to the electromagnetic wave source and electromagnetic wave measuring mechanism 124 and at the same time, connected via a transmission line 113a to the electrical characteristic measuring unit 113. The tip end 125b having the optical fiber 127 for electromagnetic wave irradiation is connected to the attachment 107a; and the optical fiber 127 is connected to the optical fiber 126 at the connection section of the attachment 107a and the tip end 125b. The transmission line 113a connected to the electrical characteristic measuring unit 113 is isolated at a connecting section between the attachment 107a and tip end 125b. When the attachment 107a and tip end 125b are connected in this way, the electromagnetic wave generated by the electromagnetic wave source and electromagnetic wave measuring mechanism 124 can be transmitted via the optical fiber 126 and irradiated via the optical fiber 127 on the semiconductor sample 118.

The tip end 125b can be detached, as illustrated in FIG. 8, from the attachment 107a; instead of the tip end 125b, an attachment of another configuration, such as a tip end 125a or 125c, can be connected. When the tip end 125a is connected to the attachment 107a, the probe 106 is connected to the transmission line 113a at a connecting section between the tip end 125a and attachment 107a, and the optical fiber 126 is isolated. In this way, when the attachment 107a and tip end 125a are connected, the electrical characteristic measuring unit 113 can measure, through the probe 106, electrical characteristics of the semiconductor sample 118. And when the tip end 125c is connected to the attachment 107a, infrared ray emitted from a desired section of the semiconductor sample 118 is received via an optical fiber 227 and inputted via an optical fiber for transmission (not illustrated) to the electromagnetic wave source and electromagnetic wave measuring mechanism 124 to measure the intensity of infrared ray; when the electromagnetic wave control mechanism 123 performs calculation based on data of the intensity of infrared ray, the temperature of the desired section of the semiconductor sample 118 can be measured.

Figure 10:
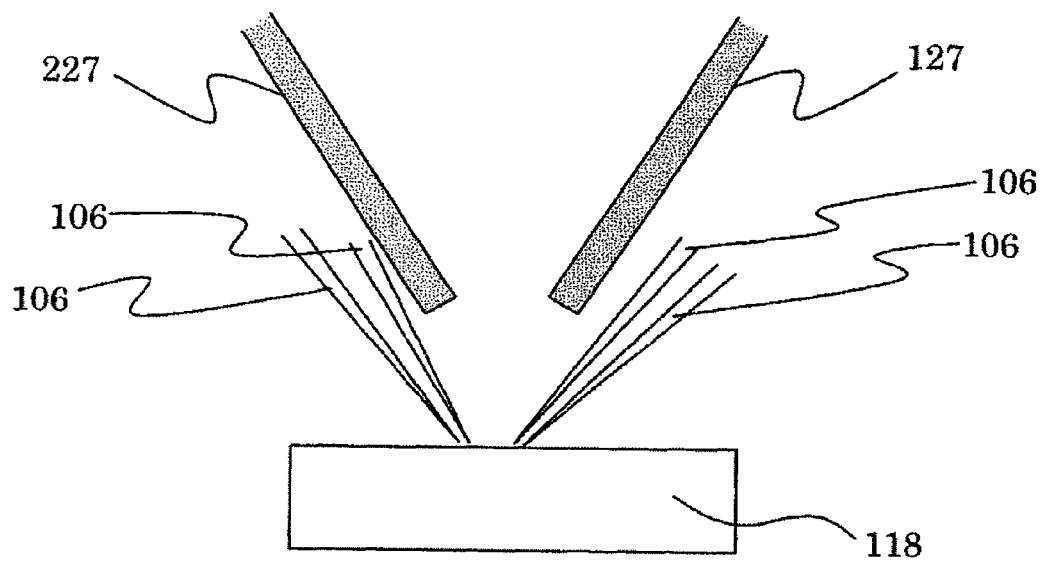
FIG. 10 is a lateral view of an optical microscope image when an electrical characteristic measurement according to the third embodiment of the present invention is performed.
Figure 11:
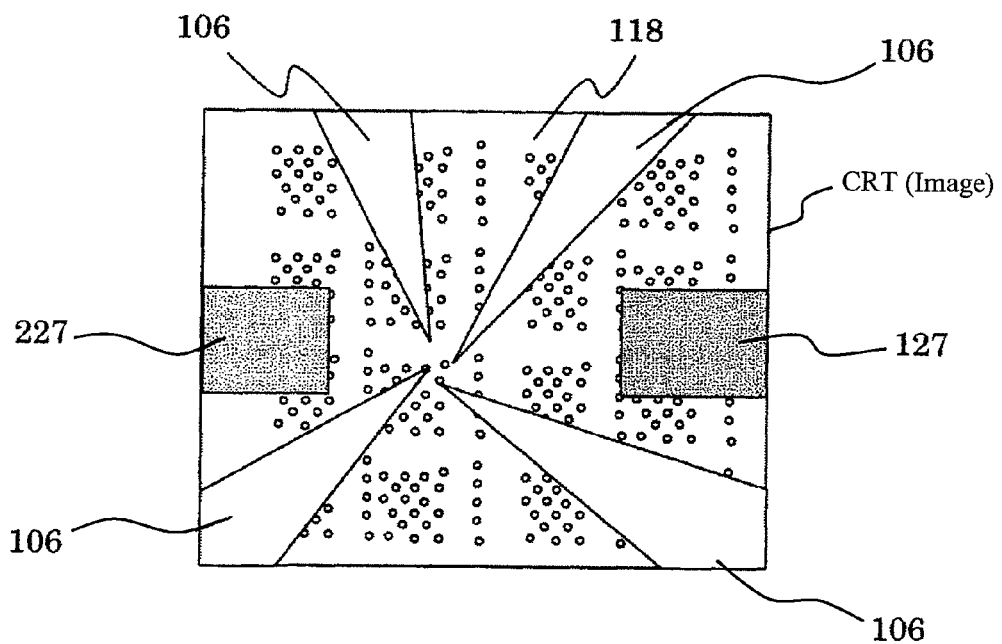
FIG. 11 is a view illustrating an SEM image when the electrical characteristic measurement according to the third embodiment of the present invention is performed.

FIG. 10 is a lateral view of an optical microscope image when an electrical characteristic measurement is performed on the semiconductor sample according to the present embodiment. FIG. 11 is a view illustrating an SEM image when the electrical characteristic measurement is performed.

Referring to FIGS. 10 and 11, the probes 106 are in contact with the measurement pads 203, 204, 205 and 206 of the semiconductor sample 118. Also, the optical fibers 127 and 227 are arranged in the vicinity of a measurement section of the semiconductor sample 118, the optical fibers facing the measurement section. In this state, the electromagnetic wave source and electromagnetic wave measuring mechanism 124 generates electromagnetic wave (for example, infrared ray or ultraviolet ray), and the electromagnetic wave is irradiated via the optical fibers 126 and 127 on the measurement section of the semiconductor sample 118. Also, infrared ray emitted from the measurement section is inputted via the optical fiber 227 to the electromagnetic wave source and electromagnetic wave measuring mechanism 124 to measure the intensity of infrared ray. Data of the intensity of infrared is sent to the electromagnetic wave control mechanism 123 and based on the data, the temperature of the measurement section of the semiconductor sample 118 can be measured. The control computer 114 regulates the intensity of infrared generated by the electromagnetic wave source 121 so that the difference between a setting temperature and the temperature of the measurement section of the semiconductor sample 118 thus acquired is reduced, whereby the temperature of the measurement section is regulated.

The other constituent components are identical to those of the first embodiment of the present invention.

According to the present embodiment having the above configuration, similarly to the first embodiment, since the measurement section of the semiconductor sample 118 is locally heated, the expansion and contraction of the sample drive apparatus 2 and sample measuring apparatus 3 can be suppressed and thus the change of temperature can be made while the sample drift is suppressed. Accordingly, when the change of temperature of the semiconductor sample 118 is made, the measurement does not need to be interrupted, as with the related art, until the sample drift settles; thus the throughput can be improved significantly, compared to the related art by which there is a wait until the sample drift settles.

Further, the electromagnetic wave irradiation position can be changed by driving the attachment 107*a* as with the probe 106, so electromagnetic wave can be irradiated on a desired section.

In the embodiment of the present invention, the descriptions were given by taking as an example, the case where the electromagnetic wave source and the electromagnetic wave measuring mechanism are integrated, but the present invention is not limited thereto; the electromagnetic wave source and the electromagnetic wave measuring mechanism may be separately arranged.

Figure 12:
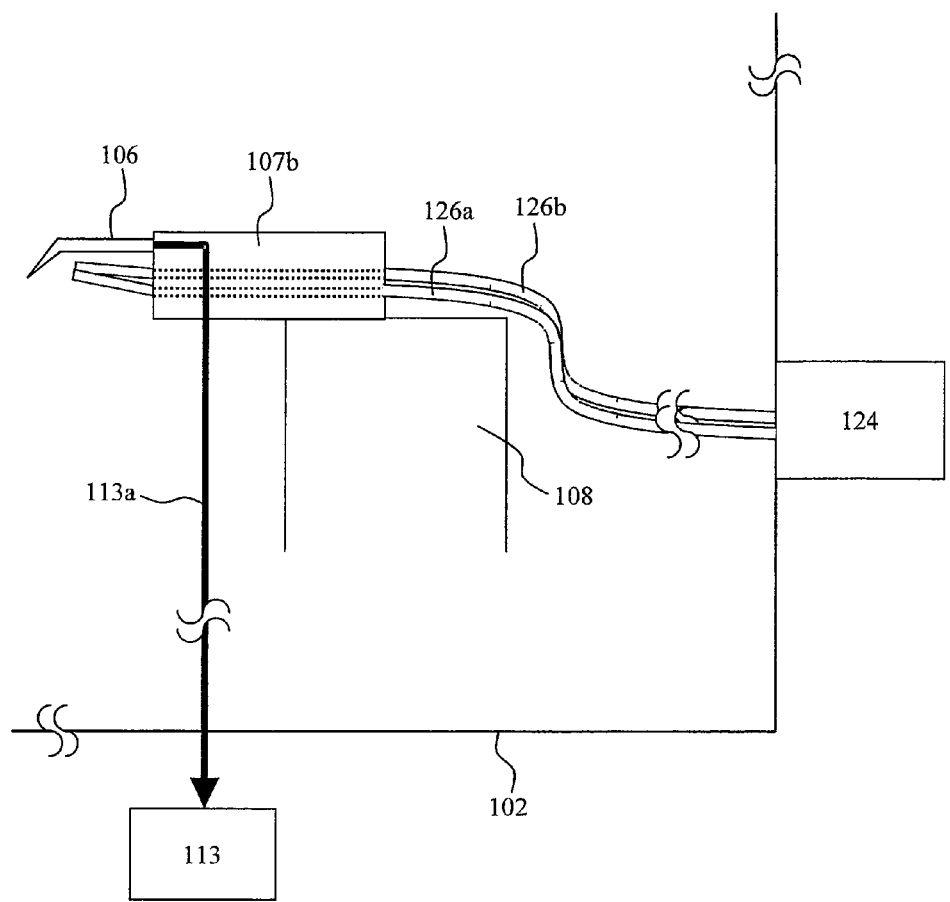
FIG. 12 is a view illustrating an attachment and its connection according to the third embodiment of the present invention.

Also, the tip end having arranged therein the optical fiber for electromagnetic wave irradiation and the tip end having arranged therein the optical fiber used to receive electromagnetic wave were separately provided, but the present invention is not limited thereto; there may be used: a tip end having arranged therein the two optical fibers; and an attachment via which the two optical fibers of the tip end can be connected to the electromagnetic wave source and electromagnetic wave measuring mechanism, respectively. FIG. 12 illustrates an attachment 107*b* in which an optical fiber 126*a* for electromagnetic wave irradiation and an optical fiber 126*b* used to receive electromagnetic wave are arranged. When this mechanism is used, it is possible to heat only the probe 106, thus allowing prevention of the thermal loss and thermal expansion occurring when the probe is brought into contact with the sample.

Further, there may also be used a tip end of optical fiber for electromagnetic wave irradiation having arranged therein a lens unit.

In the first to third embodiments of the present invention, there was described the case where an optical fiber is used as the electromagnetic wave irradiation apparatus, but the present invention is not limited thereto; for example, a lens or the like arranged integrally or separately from the electromagnetic wave generation apparatus may be used as the electromagnetic wave irradiation apparatus.

What is claimed is:

1. An inspection apparatus comprising:
   a sample stage that holds a sample;
   a plurality of probes used to measure electrical characteristics of a semiconductor device on the sample;
   a drive unit that faces the sample and drives the plurality of probes;
   a power source that applies voltage and/or current to the plurality of probes;
   a detector that measures electrical characteristics of the semiconductor device on the sample with which at least one of the plurality of probes is brought into contact; and
   a heating mechanism that heats partial regions of the sample and the plurality of probes, wherein the partial regions include measurement sections existing between a plurality of positions with which the plurality of probes are in contact.

2. The inspection apparatus according to claim 1, wherein the heating mechanism includes an electromagnetic wave source that generates an electromagnetic wave for irradiating the sample.

3. The inspection apparatus according to claim 2, further comprising an electromagnetic wave control mechanism that regulates temperatures of the measurement sections heated by the heating mechanism.

4. The inspection apparatus according to claim 1, wherein the heating mechanism comprises an optical fiber.

5. The inspection apparatus according to claim 1, further comprising an attachment used to selectively attach one of the probe and the heating mechanism to the drive unit.

6. The inspection apparatus according to claim 1, wherein the heating mechanism irradiates an infrared ray on the sample and thereby heats an infrared ray irradiated section of the sample.

7. The inspection apparatus according to claim 1, wherein the heating mechanism irradiates an infrared ray on the sample and thereby processes an infrared ray irradiated section of the sample.

8. The inspection apparatus according to claim 1, wherein the heating mechanism irradiates an ultraviolet ray on the sample and thereby removes charging or contamination of an ultraviolet ray irradiated section of the sample.

9. The inspection apparatus according to claim 1, further comprising a temperature measuring mechanism that measures a temperature of a section of the sample, wherein the section is heated by the heating mechanism.

10. The inspection apparatus according to claim 9, further comprising:
    an infrared source that generates an infrared ray to be irradiated by the heating mechanism on the sample; and
    a control apparatus that controls the infrared source based on the measurement result from the temperature measuring mechanism.

11. An inspection apparatus comprising:
    a sample stage that holds a sample;
    a plurality of probes used to measure electrical characteristics of a semiconductor device on the sample;
    a drive unit that faces the sample and drives the plurality of probes;
    a power source that applies voltage and/or current to the plurality of probes;
    a detector that measures electrical characteristics of the semiconductor device on the sample with which at least one of the plurality of probes is brought into contact; and
    a heating mechanism that heats measurement sections existing between a plurality of positions with which the plurality of probes are in contact and heats the plurality of probes before measurement sections contact the plurality of probes.

12. The inspection apparatus according to claim 11, wherein the heating mechanism includes an electromagnetic wave source that generates an electromagnetic wave for irradiating the sample.

13. The inspection apparatus according to claim 12, wherein the heating mechanism irradiates an infrared ray on the sample and thereby heats an infrared ray irradiated section of the sample.

14. The inspection apparatus according to claim 11, wherein the heating mechanism comprises an optical fiber.

15. The inspection apparatus according to claim 11, further comprising an attachment used to selectively attach one of the probe and the heating mechanism to the drive unit.

16. The inspection apparatus according to claim 11, further comprising an electromagnetic wave control mechanism that regulates temperatures of the measurement sections heated by the heating mechanism.

17. The inspection apparatus according to claim 11, wherein the heating mechanism irradiates an infrared ray on the sample and thereby processes an infrared ray irradiated section of the sample.

18. The inspection apparatus according to claim 11, wherein the heating mechanism irradiates an ultraviolet ray on the sample and thereby removes charging or contamination of an ultraviolet ray irradiated section of the sample.

19. The inspection apparatus according to claim 11, further comprising a temperature measuring mechanism that measures a temperature of a section of the sample, wherein the section is heated by the heating mechanism.

20. The inspection apparatus according to claim 19, further comprising:

an infrared source that generates an infrared ray to be irradiated by the heating mechanism on the sample; and a control apparatus that controls the infrared source based on the measurement result from the temperature measuring mechanism.

* * * * *